United States Patent [19]

Bush et al.

[11] 4,224,466
[45] Sep. 23, 1980

[54] COMBINED DATA INPUT AND TEST CIRCUIT

[75] Inventors: Vincent N. Bush, Madison Lake; Thomas K. Hiniker, Mankato, both of Minn.

[73] Assignee: Hiniker Company, Mankato, Minn.

[21] Appl. No.: 37,742

[22] Filed: May 10, 1979

[51] Int. Cl.² ............... G01R 15/12; H04L 25/02
[52] U.S. Cl. ............... 178/69 G; 324/73 AT; 340/514; 364/579; 371/27
[58] Field of Search ....... 340/177 CA, 514, 146.1 BE, 340/146.1 E; 324/73 AT; 364/579; 235/302; 179/15 BF, 175.3 R, 175.3 A, 175.3 F, 175.3 S; 178/69 G

[56] References Cited

U.S. PATENT DOCUMENTS

| Re. 30,037 | 6/1979 | Bass | 235/302 |
|---|---|---|---|
| 3,500,318 | 3/1970 | Arlen | 340/146.1 E |
| 3,838,261 | 9/1974 | Rice et al. | 324/73 AT |
| 3,943,348 | 3/1976 | Akriche et al. | 340/146.1 E |
| 4,163,210 | 7/1979 | Giraud | 235/302 |

*Primary Examiner*—Thomas A. Robinson
*Attorney, Agent, or Firm*—Merchant, Gould, Smith, Edell, Welter & Schmidt

[57] ABSTRACT

Input channels are provided for receiving data pulses from sensors or other parts of an electronic data system. Filters, for examle r-f decoupling filters, are provided for each channel prior to passing the pulses to a utilization device, such as a counter or the like. The shunt or grounding capacitors of the filters are tied together and connected to the output of a test pulse generator which performs two functions. In normal operation, the output circuit of the test pulse generator provides an effective AC path to ground for normal operation of the filters and their shunt capacitors. In a self-test mode, the test pulse generator provides a test pulse which is coupled through the shunt capacitors, the filters and optional wave shaping amplifiers to the utilization device for verification of the operative condition of the circuits.

7 Claims, 3 Drawing Figures

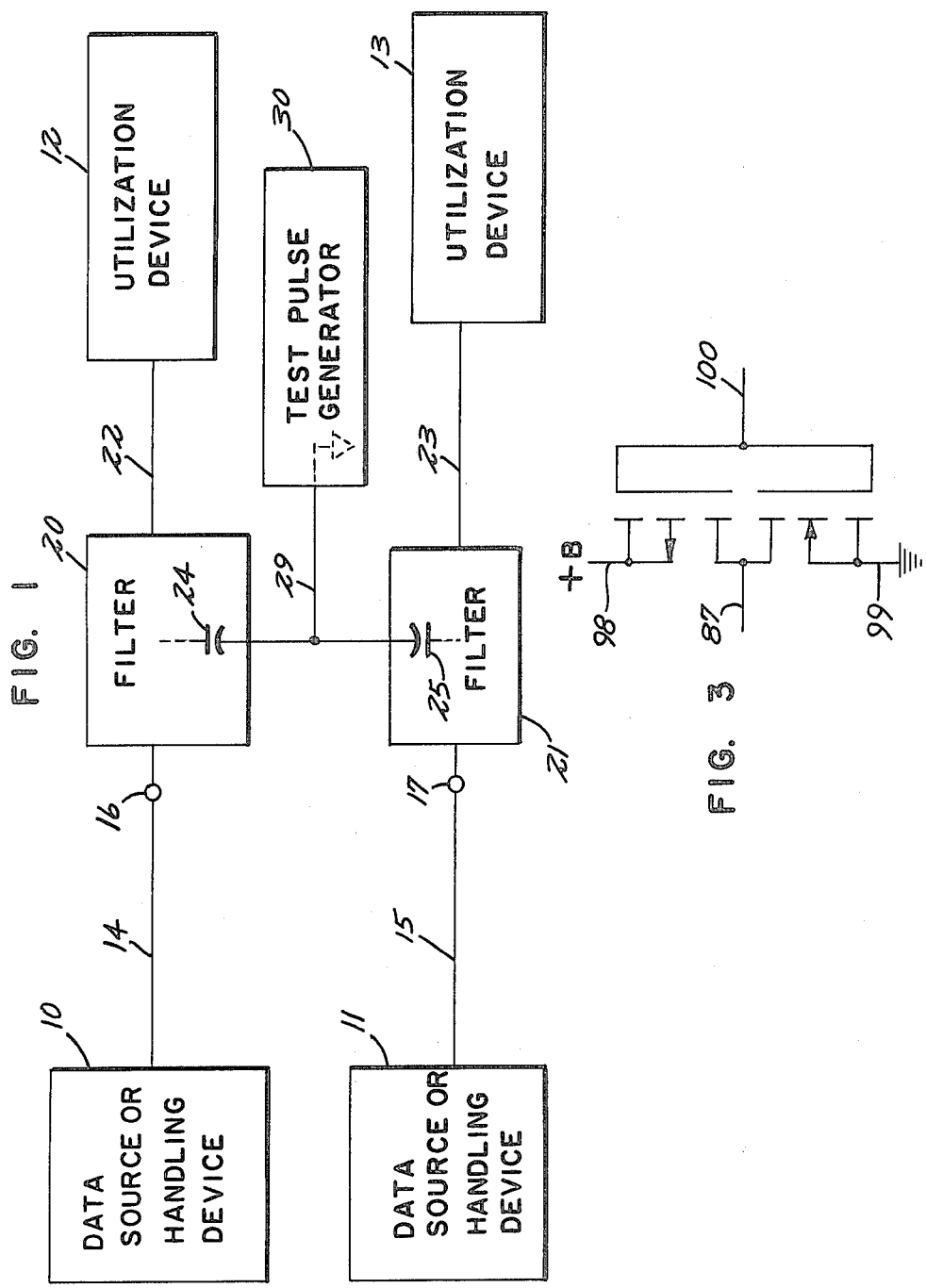

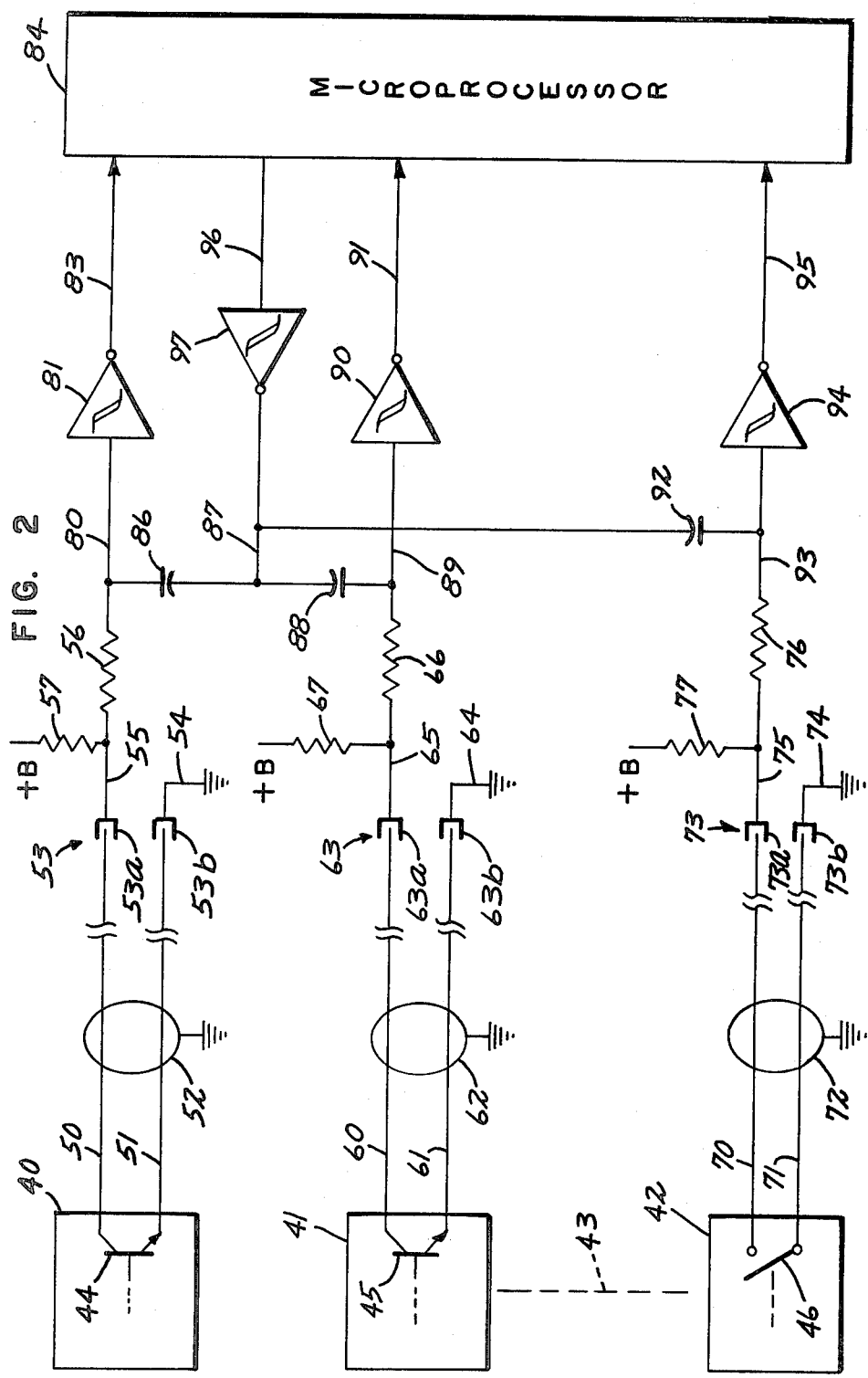

COMBINED DATA INPUT AND TEST CIRCUIT

TECHNICAL FIELD OF THE INVENTION

The invention pertains to the field of electronic data receiving and handling circuits, and more particularly to an improved data input or receiving circuit having a unique and particularly advantageous self-test circuit.

BACKGROUND OF THE PRIOR ART

In many electronic monitoring, control, or data processing or handling systems for a great number of applications, there are requirements for input circuits which receive signals from a source or another part of the system, and transmit them on to another part of the system, usually after filtering, shaping or amplifying the signals. An example might be where pulse-type signals are received at a monitoring or control circuit after having been transmitted over a cable from the sensor or other data handling or transmitting device. Often the signal pulses thus transmitted arrive at the monitoring or control circuit after suffering some attenuation, introduction of noise, and possibly also dispersion during transmission; or alternatively, due to the nature of the sensors or other source devices, the pulses are low voltage amplitude requiring wave shaping and amplifications before further transmission to the utilization, monitoring or control device involved in a particular system. Input circuits of this type are generally well known in the prior art.

It is also common to provide testing circuits in conjunction with such electronic systems whereby test pulses can be introduced at some point in the circuitry, so that their detection and receipt at some further point in the system verifies that at least certain portions of the system are in working condition. For example, in the case of a monitoring system involving remote sensors a test system may include additional switching devices associated with the remote sensors and their cables which operate in a test mode to inject pulses simulating the output of a working sensor. If the pulses are transmitted through the cables and the input circuit, including whatever filtering, wave shaping and amplifying functions it may contain, and are then transmitted to detection or utilization circuits, a positive indication of at least partial operability of the system or channel is indicated. However, the provision of self-testing circuits brings certain associated problems. For one thing, the additional components required for the self-test mode add to the initial cost of manufacture of the system. Another disadvantage is that the additional components required for the self-test mode can themselves represent a reliability problem. This is true because, as a general proposition, the greater the number of components in the system, the greater the probability that there will be a failure somewhere in the system. In particular, with respect to components of a self-test system, since they are so intimately associated with the input data path, a failure in a component there could easily have the effect of shorting, opening, or otherwise disrupting the data path or channel it was intended to serve.

BRIEF SUMMARY OF THE INVENTION

In order to overcome these disadvantages while providing an improved self-test circuit, the present invention provides a combined data input and test circuit including a plurality of input means adapted for connection to receive data pulses from sensors or other data handling or transmitting devices, for conveying the signals to one or more utilization devices which would be part of an overall electronic system. Filters are provided, including capacitance means connected for removing unwanted interference signals which may be introduced at some point in the system and which may appear at the input means. Means for generating test pulses are provided, and are selectively operative to produce test pulses when required, for example during a self-test procedure. The capacitance means of the filters are connected to the output of the test pulse generating means so that the high frequency interference signals are coupled to signal ground through the output of the test pulse generating means, and so that during a test mode, test pulses are coupled through the capacitance means and on through the input circuit. This has the advantage of providing a positive test for the filter capacitors and the input amplifiers if any, while avoiding the disadvantages of requiring a great number of parts and presenting additional potential reliability problems.

BRIEF DESCRIPTION OF THE DRAWINGS

In the drawing,

FIG. 1 is a block diagram of the input portion of a typical electronic monitoring or data handling system, incorporating the combined input and test circuit according to the present invention;

FIG. 2 is an electrical schematic diagram showing a presently preferred embodiment of the combined data input and test circuit according to the present invention; and FIG. 3 is a diagrammatic representation of a typical output stage of a CMOS device which may be used as the test pulse generator output stage of the embodiment of FIG. 2.

DETAILED DESCRIPTION OF THE INVENTION

FIG. 1 shows in block diagram form, a two channel input circuit utilizing the present invention, although it will be understood that the invention is applicable to any number of channels, from a single channel to as many channels as may be required for a given system application. Reference numbers 10 and 11 indicate data sources or data handling devices, generally. These devices may be sensors, transducers or other devices which generate data pulses in a particular system; they may be data receiving, transmitting, or processing devices; or they may simply be links for transmitting data from one point in a system to another point, in this case the utilization devices 12 and 13. Devices 10 and 11 may be considered to be data "sources" in the sense that they are the immediate sources of data to be fed to utilization devices 12 and 13, whether or not they originate the data or merely pass it on from a previous stage or stages (not shown).

Utilization devices 12 and 13 may similarly be any type of device, according to the overall function and design of the system with which the input circuit of the present invention is to be used. Devices 12 and 13 may be control or monitoring devices designed to receive, and act on, data pulses from devices 10 and 11, respectively.

Data device 10 delivers its data pulses over a conductor 14 to a terminal or other input point 16. Terminal 16 connects through filter 20 and conductor 22 to utilization device 12. In similar fashion, data device 11 delivers its pulses over conductor 15 to terminal 17 which then connects through filter 21 and conductor 23 to ultilization device 13.

Filters 20 and 21 are radio frequency (r-f) decoupling filters of any design as is generally known, and their purpose is to remove unwanted interference signals appearing at the inputs 16 and 17, prior to sending the data signals to utilization devices 12 and 13. The unwanted interference or noise signals might have been picked up in conductors 14 and 15, in devices 10 or 11, or perhaps in some earlier stages, but generally it is necessary to remove the interference or noise so as to avoid presenting false signals to utilization devices 12 and 13. The r-f filters 20 and 21 are of the type which include one or more shunt or grounding capacitors, and these are indicated by reference numbers 24 and 25. However, instead of directly grounding these capacitors, according to the present invention they are connected together at lead 29 which connects to the output of a test pulse generating means 30.

The output circuit of generator 30 in effect performs a dual function. One function is to provide an effective path to ground for conductor 29 and capacitors 24 and 25 of the filters. This can be accomplished either through the output stage to signal ground directly (possibly through a nominal resistance); or through the output stage to the energizing power supply for the circuit, which also is a signal ground with respect to AC signals. The other function performed by generator 30 is to provide pulses, during a test mode, to lead 29. This can be accomplished by an operator test push button and appropriate pulse generating circuits as are generally known in the art, or it could be accomplished by some type of computer or other automated self testing circuitry. In either case, one or more test pulses are produced at lead 29, and these are coupled through capacitors 24 and 25, leads 22 and 23 to utilization devices 12 and 13, where receipt of the pulses verifies operation of the filter capacitors, possibly additional circuitry within the filters, and the input circuits of the utilization devices. Also, if there are amplifiers or wave shaping circuits included in series between the filters and the utilization devices, the test pulses will provide a verification of the operation of those devices also. Of course, it would also be possible to provide separate test pulse generators 30 for each filter capacitor and channel, rather than tying the capacitors together at lead 29, but there is little or no advantage in doing so unless for some reason it is necessary to provide separate test pulses for each channel.

The operation of the invention of FIG. 1 is more clearly shown with respect to the specific circuitry of the preferred embodiment of FIG. 2. In this embodiment devices 40, 41, and 42 represent sensors or other transducers which provide electrical data pulses in response to the occurrence of certain monitored events. While three sensors are shown and the corresponding input circuit has three channels, it will be appreciated that any number of sensors and channels, from a single channel on up, could be used, and broken line 43 indicates that additional sensors could be provided. Each of the sensors includes a switching device in the embodiment shown. For example, devices 40 and 41 include output NPN transistors 44 and 45. For purposes of illustration, device 42 shows a mechanical switch having a movable contact 46. It is immaterial which of the devices have mechanical or electronic switches, as the invention will work equally well with any type of sensor or data source. Switches 44, 45, and 46 provide controlled switching action in response to the monitored process or events for which the particular transducer was designed.

The collector and emitter of transistor 44 connect respectively to conductors 50 and 51 which form a portion of a connecting cable, which may also have a grounded shield as indicated by reference number 52. The cable connects to input terminal or connector 53 of the input circuit. Specifically, lead 50 connects through connector 53a to lead 55, and lead 51 connects through connector 53b to lead 54 to signal ground. A biasing or pull-up resistor 57 connects from lead 55 to the voltage source or power supply +B. Lead 55 also connects to one terminal of resistor 56, which forms a part of the r-f filtering circuit.

In similar fashion, device 41 connects to the input circuit of the second channel as indicated by the components having reference numbers 60–67, which correspond to components 50–57 previously described. In the same manner, the terminals of contact 46 of device 42 connect through components 70–77 of the third input channel, and if additional input channels are provided, similar connections and components would likewise be provided.

It will be appreciated that, depending upon the design of the particular sensors or transducers used for devices 40 and 41, it may be necessary to provide an additional conductor in the cables which include connectors 50, 51, and 60, 61, so that the +B power supply can be delivered to other circuitry within the devices. However, for purposes of clarity of FIG. 2, such power supply leads have been omitted.

In the preferred embodiment shown in FIG. 2, a simple RC low pass filter is used for the r-f decoupling filter, although it will be understood that more complex multiple pole or active filters could be used as are generally known in the art, if required for a particular application.

Resistor 56 connects to lead 80 which leads to the input of amplifier 81. In the preferred embodiment amplifier 81 is a Schmitt trigger circuit for providing additional noise immunity while shaping or squaring the data pulses and amplifying to restore logic levels. The preferred embodiment makes use of integrated circuit CMOS circuits for amplifier 81 and the other amplifiers of the circuit, but it will be appreciated that other types of amplifiers or wave shaping circuits could also be used. For purposes of clarity, the power supply connections to amplifier 81 and the other amplifiers in the circuit have been omitted. The output of Schmitt trigger 81 connects through lead 83 to microprocessor 84, which in this embodiment comprises the utilization device for the data pulses which are being received.

Capacitor 86 is the other part of the r-f filter for the first channel, and it connects from lead 80 to lead 87. Capacitor 88 for the second channel connects from lead 89 to lead 87. Lead 89 also connects to the input of another Schmitt trigger wave shaping amplifier 90, and its output connects via lead 91 to another input to microprocessor 84. In the same manner, capacitor 92 for the third channel connects from lead 93 to lead 87. Lead 93 for the third channel connects from resistor 76 to the input of Schmitt trigger 94, whose output connects via lead 95 to another input of microprocessor 84.

An output of microprocessor 84 connects through lead 96 to the input of another amplifier 97 which, for convenience, can be another Schmitt trigger, although any other type of amplifier can be used. The output of amplifier 97 connects to lead 87.

For purposes of illustration of a given example, FIG. 3 shows a schematic representation of a typical output stage of a CMOS device such as pulse generating amplifier 97. The output is taken at lead 87 which connects to the filter capacitors as shown in FIG. 2. Other terminals from the output stage connect to the power supply +B of the circuit via lead 98, and to signal ground via lead 99. Lead 100 indicates the input from a previous stage of the device. The output stage shown in FIG. 3 does not ordinarily operate in a linear mode, but rather in a digital mode in which lead 87 is switched between leads 98 and 99 by the action of the control voltages at lead 100. In one output state a relatively high resistance is provided between leads 98 and 87, while only a nominal resistance of perhaps 500 or 1,000 ohms exists between leads 87 and 99. In this output state, lead 87 is effectively connected to signal ground, and the filter capacitors 86, 88, and 92 are effectively grounded for purposes of shunting the unwanted r-f interference signals to ground.

In the other output state of the output stage of FIG. 3, a large resistance is provided between leads 87 and 99, while only a nominal resistance of perhaps 500 or 1,000 ohms is presented between leads 87 and 98. In this state lead 87 is effectively connected to the power supply providing a logical one output state for the device. However, even in this state, although lead 87 is at a logical one, it is in effect coupled to signal ground for purposes of AC signal from the r-f filter capacitors. The unwanted r-f signals are coupled through the capacitors, through lead 87 to the power supply at lead 98 which is the same as signal ground for purposes of AC signals. Thus, it does not matter whether amplifier 97 of FIG. 2 is selected to normally operate with a logical zero or a logical one output, because either way an effective AC ground is provided.

In operation, assume that devices 40, 41, and 42 provide a series of data pulses corresponding to the occurrence of events being monitored. These pulses are transmitted through the cables to the input means. Specifically, with reference to the first channel, if transistor 44 is off, a high voltage or logical one signal appears at lead 55, and if transistor 44 is on, lead 55 is effectively grounded, thus providing a ground or logical zero signal. Any r-f interference signals picked up, for example in the cables, are shunted to ground by the r-f decoupling filter which includes resistor 56 and capacitor 86. These values are selected in accordance with the bandwidth of the data pulses to be passed relatively unaffected to amplifier 81, the frequency of the unwanted r-f signals, and the usual design criteria for filters as generally known in the art. The values are selected generally high enough so that any nominal resistance existing between lead 87 and an effective AC signal grounding does not affect the desired filtering action.

The data pulses are received, shaped, and amplified to restore logic levels and transmitted to microprocessor 84 where they are counted, monitored, or otherwise used according to the overall design purpose of the particular system involved. A similar action to that described above takes place with respect to the second and third channels, so that unwanted r-f signals are filtered out from all three channels, and the desired data pulses are delivered to the various inputs of microprocessor 84.

During the self-test mode, microprocessor 84 provides a signal or pulse at lead 96 which causes amplifier 97 to produce an output pulse at lead 87. The originating signal or pulse for the test at lead 96 could be also provided by a manual push button, either directly or through separate input to the microprocessor signalling the start of the test procedure, or the initiating signal could be generated by the microprocessor as a part of a separate programmed test procedure. In any case, the test pulse produced at lead 87 is coupled through all three capacitors 86, 88, and 92 (plus any others if additional channels are used), through their respective amplifiers 81, 90, and 94, to the corresponding inputs to microprocessor 84. The receipt of these pulses verifies operation of the r-f capacitors 86, 88, and 92, and amplifiers 81, 97, and 94, plus any additional buffers or input circuits that may be present between these amplifiers and the receiving or verifying circuit. In addition, the circuit will perform a limited test of resistors 56, 66, and 76, to the extent that if transistors 44 and 45 are either on or shorted, or if contact 46 is closed, then if any of the resistors 56, 66, or 76 are shorted, the test pulse will not be received by the microprocessor for the corresponding channel.

The test pulse generated at lead 87 can be of either polarity, depending upon whether a leading or trailing edge is to be detected. The pulse width is adjusted according to the capacitance and resistance values of the filter so as to get the desired verification pulse at the microprocessor.

Although the circuit of FIG. 2 does not test the cables and connectors which connect the data devices 40, 41, and 42 to the inputs, nor does it check the pull-up resistors, it is believed that for many applications this turns out to be an advantage, rather than a disadvantage. For one thing, if one of the data devices, the cable or input connectors is either open or shorted, although this cannot be detected during the self-test mode described above, it will be immediately apparent during normal operation when no data pulses at all are received, thus signalling a failure to be checked into.

Also, if a complete self-test were to be provided, it would require an additional lead or leads in the cable from the input means 53 to the device 40, and possibly another transistor or switching device to provide a test pulse. While such a system would test transmission of the pulse all the way through to the microprocessor, it must be appreciated that a test pulse device, transistor switch or other device connected anywhere in the path from transistor 44, lead 50, connector 53, lead 55, or lead 80 carries with it the possibility that if the test device fails by shorting out, the entire channel is disabled. On the other hand, such a system as just postulated would still not be able to test capacitor 86 or the other filter capacitors for the other channels, thus leaving open the possibility that the data path from device 40 to the microprocessor may be working, but the r-f filter may not. This would result in allowing a certain amount of noise to pass through amplifier 81 and be received as a data signal. In such a case, unlike the case of a complete open or short somewhere in the data circuit, there would be no immediately apparent indication of a fault in the channel, but rather a certain number of extra or false pulses would appear at lead 83 which would give an erroneous count if, for example the pulses were being counted in microprocessor 84. The present invention avoids that disadvantage by coupling its test pulses through the filter capacitors as part of the test. Also, since the test pulse generating circuit couples through the capacitors, most types of failures of the generating circuit, for example amplifier 97, while disabling the test function, would not short out and disable the data channels.

It will be apparent from the foregoing that although positive logic and bias voltages are shown, the concept of the circuit is equally applicable both to positive or negative logic or reference voltages as will be readily apparent to those skilled in the art.

By way of example only, the embodiment of FIG. 2 has been used successfully in a two channel data input system for a sprayer monitor for agricultural equipment, in which one of the transducers 40, 41 provides pulses from a pulse wheel indicating travel of the farm tractor over the surface of the ground, and the other provides pulses from a digital flow meter indicating quantity of fertilizer or insecticide being sprayed. The r-f filters remove stray interference and noise, for example originating from the alternator or possibly other equipment associated with the tractor and picked up through the cables from the sensors to the monitor console where the input circuits are located. The data pulses are delivered to a microprocessor which counts them and performs calculations, for example to provide gallons per acre measurements.

From the foregoing description, it will be apparent to those skilled in the art that the improved combined input and test circuit of the present invention is equally applicable to other types of electronic monitoring, control, or data processing or handling systems.

We claim:

1. A combined data input and test circuit, comprising:
  a plurality of input means adapted for connection to receive data pulses from sensors or other data handling or transmitting devices, for conveying said signals to a utilization device;
  filter means including capacitance means connected for removing unwanted interference signals from said input means;
  test pulse generating means selectively operative to produce test pulses; and
  means for connecting said capacitance means to the output of said test pulse generating means so that test pulses generated thereby are coupled through the capacitance means to a utilization device and so that said unwanted interference signals are coupled to signal ground through the output of said test pulse generating means.

2. A combined test circuit and data pulse input circuit, comprising:
  a plurality of input means for connection to receive data pulses from sensors or other data handling or transmitting devices;
  radio frequency decoupling filter means connected to said input means and including capacitance means for removing unwanted radio frequency interference signals from said input means;
  test pulse generating means selectively operative to produce test pulses, and having an output circuit with an output terminal providing an effective AC signal path or signal ground, or through the energizing power supply for the circuit to signal ground; and
  means for connecting said capacitance means to said output terminal of said test pulse generating means, whereby the unwanted interference signals are normally passed to signal ground through the output circuit of the test pulse generating means and whereby test pulses produced are normally coupled through said capacitance means to be received by a utilization device to verify at least partial operation of the input circuit.

3. A combined test circuit and data pulse input circuit according to claim 2 further including amplifier means connected to receive filtered pulses from said filter means for providing amplified, shaped or restored data pulses for a utilization device.

4. An input circuit for a data receiving and handling system, having a self-test circuit, comprising:
  a plurality of input means for connection to receive data pulses from sensors or other data handling or transmitting devices;
  radio frequency decoupling filters connected to individual ones of said input means, said filters including shunt capacitors for removing unwanted radio frequency interference signals from said input means;
  input amplifiers connected to said filters to received filtered data signals from the input means and to provide outputs for transmitting to a utilization device;
  a test pulse generator selectively operative to produce test pulses, and having an output circuit with an output terminal providing an effective alternating current signal path to signal ground, either directly or through the energizing power supply for the circuit; and
  said shunt capacitors of said radio frequency decoupling filters connected together to said output terminal of said test pulse generator, whereby the unwanted interference signals are normally passed to signal ground through the output circuit of the test pulse generator, and whereby test pulses which are produced are normally coupled through said shunt capacitors to their respective input amplifiers for reception by a utilization device and verification of at least partial operation of the input circuit.

5. An input circuit according to claim 4 wherein said input amplifiers comprise Schmitt trigger circuits.

6. An input circuit according to claim 4 wherein said filters comprise resistance-capacitance low pass filters with resistors in series with said input means and said input amplifiers and capacitors connecting from said resistors and input amplifiers to said output circuit of said test pulse generator.

7. An input circuit according to claim 6 further including bias resistors connected to said input means and to a voltage source whereby the input circuit is adapted for use with switch-type sensors to produce data pulses at said input means.

* * * * *

UNITED STATES PATENT AND TRADEMARK OFFICE
CERTIFICATE OF CORRECTION

PATENT NO. : 4,224,466
DATED : September 23, 1980
INVENTOR(S) : Vincent N. Bush and Thomas K. Hiniker It is certified that error appears in the above—identified patent and that said Letters Patent are hereby corrected as shown below:

Column 8, line 2, "or" (first occurrence) should be --to--

Column 8, line 29, "received" should be --receive--

Signed and Sealed this

Twenty-fourth Day of February 1981

[SEAL]

Attest:

RENE D. TEGTMEYER

Attesting Officer     Acting Commissioner of Patents and Trademarks